United States Patent
Ishihara et al.

(10) Patent No.: US 6,194,899 B1
(45) Date of Patent: Feb. 27, 2001

(54) TEMPERATURE MONITORING METHOD, TEMPERATURE MONITORING APPARATUS AND MAGNETIC RESONANCE APPARATUS

(75) Inventors: Yasutoshi Ishihara, Tokyo; Masaaki Umeda, Kawasaki; Hidehiro Watanabe, Yokohama; Kazuya Okamoto, Yono, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/251,488

(22) Filed: Feb. 17, 1999

(30) Foreign Application Priority Data

Feb. 19, 1998  (JP) .................................................. 10-037481

(51) Int. Cl.$^7$ ....................................................... G01V 3/00
(52) U.S. Cl. ........................................... 324/315; 600/412
(58) Field of Search ................................... 324/315, 306, 324/307, 309, 300; 600/410, 412

(56) References Cited

U.S. PATENT DOCUMENTS

| | | | |
|---|---|---|---|
| 4,558,279 | 12/1985 | Ackerman et al. .................. | 324/315 |
| 5,378,987 | 1/1995 | Ishihara et al. ...................... | 324/315 |
| 5,492,122 | * 2/1996 | Button et al. ......................... | 324/315 |
| 5,916,161 | * 6/1999 | Ishihara et al. ...................... | 324/315 |

FOREIGN PATENT DOCUMENTS 6-98866  4/1994  (JP) .

OTHER PUBLICATIONS

J.C. Hindman, "Proton Resonance Shift of Water in the Gas and Liquid States", The Journal Of Chemical Physics, vol.44, No. 12, 1966, pp. 4582–4592.

L.D. Hall, et al. "Mapping of pH and Temperature Distribution Using Chemical–Shift–Resolved Tomography", Journal Of Magnetic Resonance, vol. 65, 1985, pp. 501–505.

Yasutoshi Ishihara, et al. "A Precise and Fast Temperature Mapping Using Water Proton Chemical Shift", Magnetic Resonance In Medicine, vol. 34, 1995, pp. 814–823

Kaygayaki Kuroda, et al. "Temperature Mapping Using Water Proton Chemical Shift Obtained with 3D–MRSI: Feasibility in Vivo", Magnetic Resonance In Medicine, vol. 35, 1996, pp. 20–29.

* cited by examiner

Primary Examiner—Louis Arana
(74) Attorney, Agent, or Firm—Oblon, Spivak, McClelland, Maier & Neustadt, P.C.

(57) ABSTRACT

An absolute temperature measuring pulse sequence is executed and, subsequently, a relative temperature measuring pulse sequence is repeatedly executed. Since while a relative temperature can be measured from phase information, an absolute temperature requires frequency information, a time required in the relative temperature measuring pulse can be made shorter than that required in the absolute temperature measuring pulse sequence. Since the relative temperature reveals a temperature variation, if an absolute temperature at a given time is known, an absolute temperature at a subsequent time can be calculated from the relative temperature. Thus, a local internal temperature of the subject can be measured, with a shorter temporal resolution, with the use of the absolute temperature and relative temperature.

20 Claims, 4 Drawing Sheets

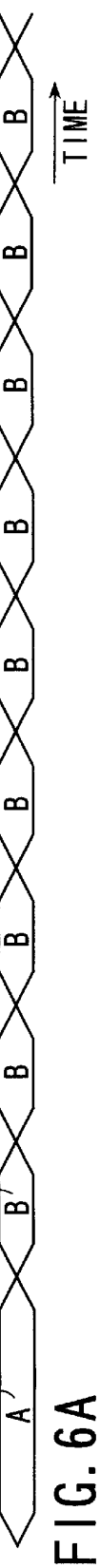
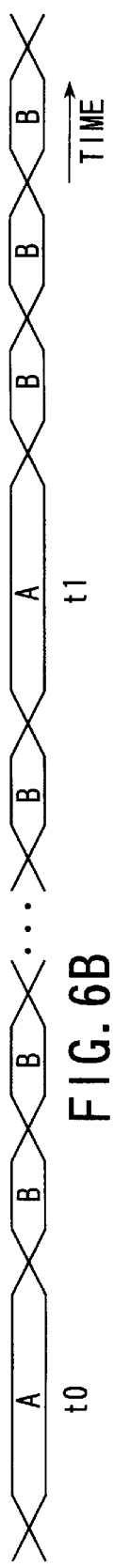
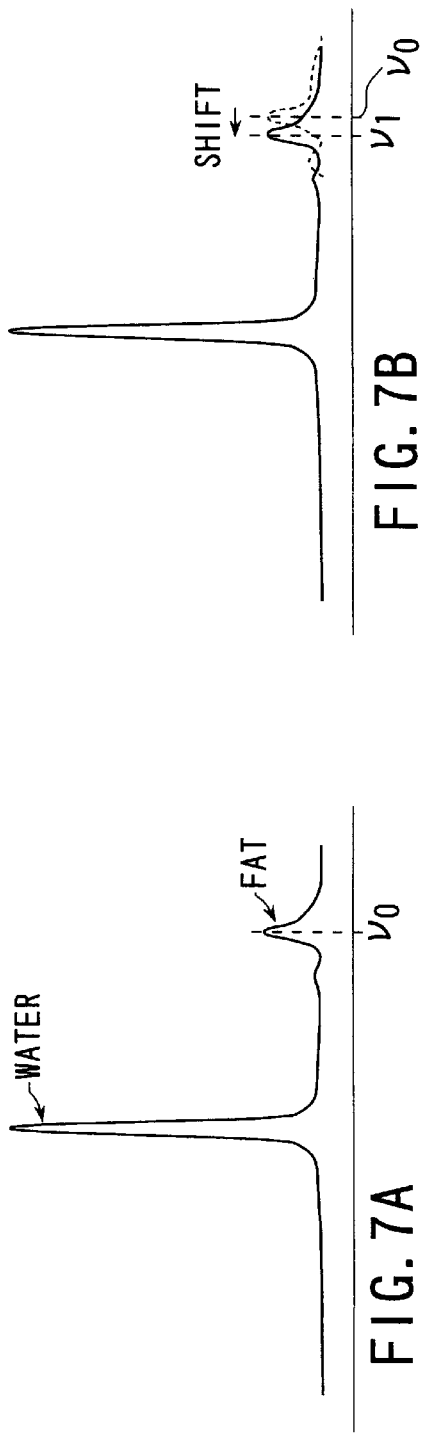
FIG. 6A  A PULSE SEQUENCE FOR MEASURING AN ABSOLUTE TEMPERATURE, SHOWN BY FIG. 3A
FIG. 6B  A PULSE SEQUENCE FOR MEASURING A RELATIVE TEMPERATURE, SHOWN BY FIG. 4
FIG. 7A
FIG. 7B

TEMPERATURE MONITORING METHOD, TEMPERATURE MONITORING APPARATUS AND MAGNETIC RESONANCE APPARATUS

BACKGROUND OF THE INVENTION

The present invention relates to a temperature monitoring method and apparatus which, in order to monitor the internal temperature of a subject during a period of a brain hypothermia primarily applied to a brain disease and cerebropathia, acquire a temperature variation in the inside of the subject by utilizing a magnetic resonance phenomenon and display it and to a magnetic resonance apparatus.

The results of treatment on the brain disorders, such as the brain trauma, brain blood vessel disorder and hypoxia cerebropathia at a time of the stoppage of a cardiopulmonary function are governed by conditions of the brain edema and intracranial pressure exacerbation involved due to the ischemia. For this reason, it is very important to measure the intracranial pressure level and internal jugular sinus venous blood oxygen saturation level and, by doing so, control the subject.

In recent times it has been clarified that, due to an intrabrain heat retention resulting from re-perfusion following the brain disorder a secondary phase of disease appears in advance of the brain edema. It has been, therefore, indicated that it is important to continue treatment while controlling the temperature of the brain.

Attention has recently been paid to the brain hypothermia which, in order to protect to a brain from a brain injury region and resuscitate the brain, lowers the temperature of the brain to 32° to 34° C. and maintains this state for an about 2-days to one-week period (an about two-days to two-weeks period though depending upon the case)— Intensive & critical care medicine Vol. 9, No. 6, 613-689 (1997) issued by Sohgo Igaku Co., Ltd.

It has been difficult to exactly measure the temperature of the brain in real time during the brain hypothermia period. It has been conventional practice to measure the blood temperature primarily responsible for the brain temperature formation, with the use of a catheter sensor set in the internal jugular vein and use it in place of the brain temperature.

It has been reported that, for a normal subject, such internal jugular vein temperature is approximately equal to the brain temperature (Hayashi, Intensive & critical care medicine vol. 7, No. 3, 267-274 (1997)). It has also been reported that a temperature profile is produced in the brain in the case of a patient with the brain disorder. And a non-invasive and high accurate temperature measuring method has thus been desired.

BRIEF SUMMARY OF THE INVENTION

It is accordingly the object of the present invention to measure a local internal temperature in a subject with a short temporal resolution with the use of an absolute temperature.

In the present invention, a pulse sequence for absolute temperature measurement is executed and then a pulse sequence for relative temperature measurement is repeatedly executed. Since the absolute temperature requires frequency information while the relative temperature can be measured from phase information, a time necessary to the pulse sequence for relative temperature measurement can be made shorter than that necessary to the pulse sequence for absolute temperature measurement. Further, the relative temperature reveals a temperature variation and, if an absolute temperature at a given time is found, then that absolute temperature at a sequential time can be calculated from the relative temperature. It is, therefore, possible to measure a local internal temperature in the subject, with a shorter temporal resolution, with the use of the absolute temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a view showing a flow of a temperature monitoring pulse sequence executed according to the present embodiment;

FIG. 6B is a view showing a flow of a pulse sequence for a motion error detection function-equipped temperature monitoring feature according to the present embodiment;

FIG. 7A is a view showing a proton spectrum analyzed from an MR signal acquired at an absolute temperature measuring pulse sequence at time $t_0$ in FIG. 6B; and FIG. 7B is a view showing a proton spectrum analyzed from an MR signal acquired at an absolute temperature measuring pulse sequence at time $t_1$ in FIG. 6B.

DETAILED DESCRIPTION OF THE INVENTION

Figure 1:
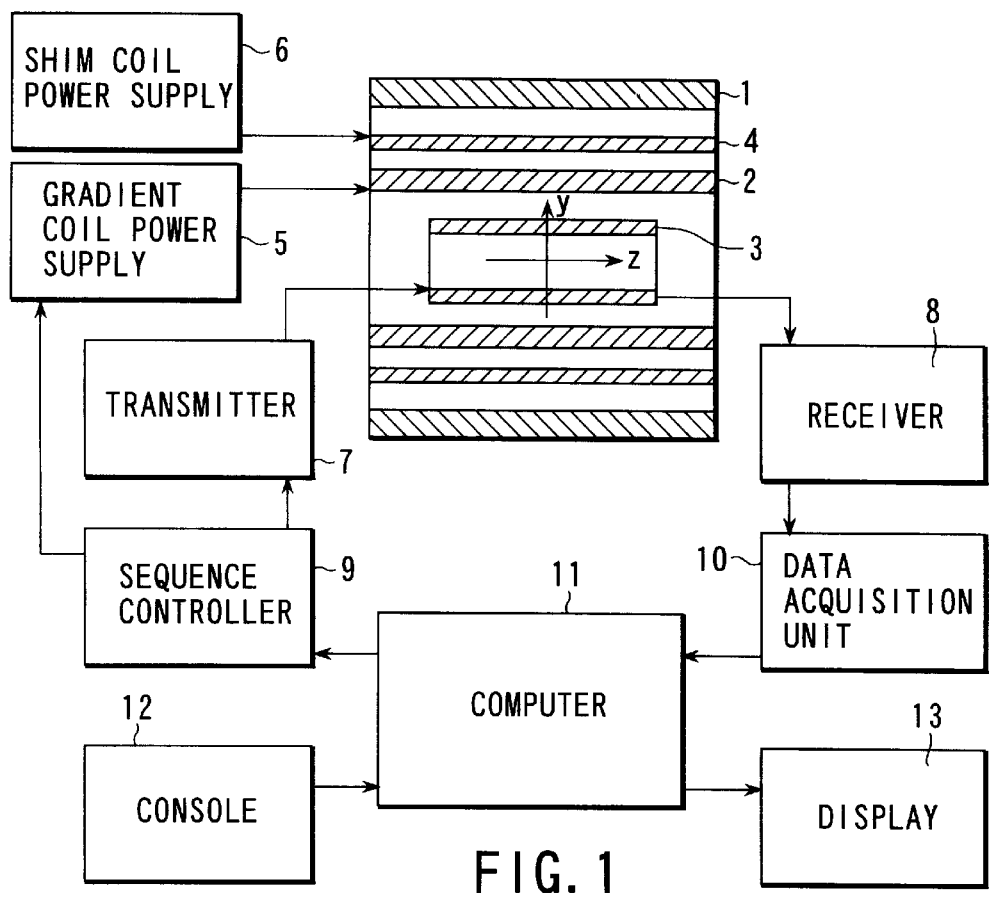
FIG. 1 is a view showing a temperature monitoring apparatus (magnetic resonance apparatus) according to a preferred embodiment of the present invention.

A temperature monitoring apparatus, or a magnetic resonance apparatus having a temperature monitoring function, according to the present invention will be described in more detail below with reference to the drawing.

FIG. 1 is a block diagram showing an arrangement of the temperature monitoring apparatus. The internal temperature measurement of the present embodiment is conducted by utilizing the property according to which the resonance frequency of a proton in $H_2O$ reveals a temperature dependence, that is, varies with the temperature, and the property according to which the resonance frequency of a proton in fat exhibits no temperature dependence, that is, undergoes almost no variation irrespective of the temperature. Needless to say, a target nucleus is not restricted to the proton and to an $H_2O$/fat combination one of which a molecule containing such a target nucleus is composed.

A static magnet 1 generates a static magnetic field. Inside the static magnet 1, a shim coil 4, gradient coil 2 and RF probe 3 are arranged.

The shim coil 4 is driven by a shim coil power supply 6 to generate a magnetic field for correcting an inhomogeneous static field. The magnetic field generated from the shim coil 4 is added to the static field and, by doing so, it is possible to enhance the homogeneity of the static magnetic field. It is to be noted that the axis in a coordinate corresponding to the direction of the static field is defined as a z-axis.

The gradient coil 2, being driven by a gradient coil power supply, generates a gradient field on the x-axis, a gradient field on an y-axis and a gradient field on a z-axis. The RF probe 3 is arranged inside the gradient coil 2 and comprises an RF coil and a tuner to allow the target nucleus, here, a proton, to be tuned to a resonance frequency. The RF probe 3 is connected by a duplexer to a transmitter 7 at a transmit time and to a receiver 7 at a receive time.

The transmitter 7 supplies an RF current pulse to the RF probe 3. By doing so, the RF coil generates an RF magnetic field (rotating magnetic field). Further, the receiver 8 receives an MR signal via the RF coil which is generated from a proton spin in the subject, and then amplified and detected. In this connection it is to be noted that the RF probe 3, though being of a transmit/receive-combined type, may be separated into a transmit-and a receive-only probe.

A data acquisition unit 10 converts the MR signal which is received by the receiver 8 into a digital signal and, after being temporarily stored, transferred one at a time to a computer 11. The computer 11 has, in addition to a function of serving as a center for controlling a system as a whole, a function of creating an MR image from an inside of the subject on the basis of the MR signal, a function of calculating an absolute temperature on the basis of the MR signal, a function of calculating a relative temperature on the basis of the MR signal, a function of converting the relative temperature into the absolute temperature, a function of creating display data on the absolute temperature and relative temperature and outputting it to a display 13 and a function of detecting a motion error on the basis of a temporal variation corresponding to a resonance frequency of a fat's proton not revealing any temperature dependence.

A sequence controller 9 keeps pulse sequence data for imaging, pulse sequence data for measuring the absolute temperature, and pulse sequence data for measuring the relative temperature. The three kinds of these data are selectively loaded under the control of the computer and executed. The sequence controller 9 controls the gradient coil power supply 5, shim coil power supply 6, transmitter 7, receiver 8 and data acquisition unit 10. In this way, the selected pulse sequence is executed and an MR signal for measuring the absolute temperature and MR signal for measuring the relative temperature are acquired in accordance with the pulse sequence.

Figure 2:
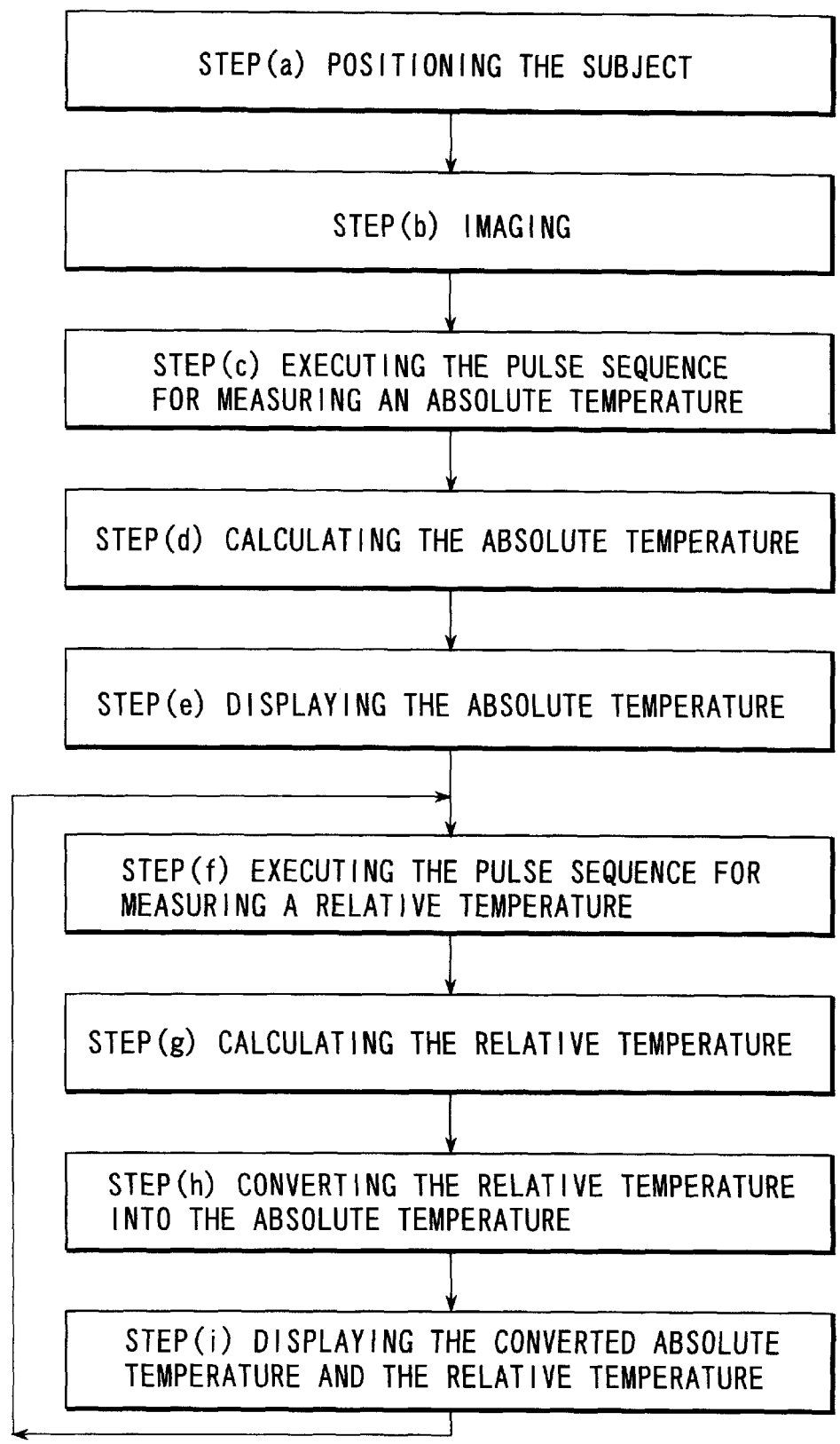
FIG. 2 is a view showing a whole flow of internal temperature monitoring made according to the present embodiment.

FIG. 2 shows a whole flow of a temperature monitoring operation by the present embodiment. Here it is assumed that a cerebropathia region's temperature is monitored in this case.

First, a subject is positioned in an imaging area at step (a). In this case it is desirable that a mechanism, such as allowing a movable type bed's top plate to slide onto a bed of the magnetic resonance apparatus, be installed so that the movable bed with the subject positioned thereon can be readily carried onto the bed on the magnetic resonance apparatus. Further, it is also desirable from the standpoint of an operation to adopt a structure with a "drip" device and other devices fixed to the top plate.

Then, a pulse sequence for imaging is executed by the sequence controller 9 at step (b). This pulse sequence comprises a spin echo method, or a field echo method, adopting a two-dimensional Fourier transformation (2DFT) method for example. By doing so it is possible to obtain an MR image of a cross-section including the cerebropathia region corresponding to a temperature monitoring target.

Figure 3A:
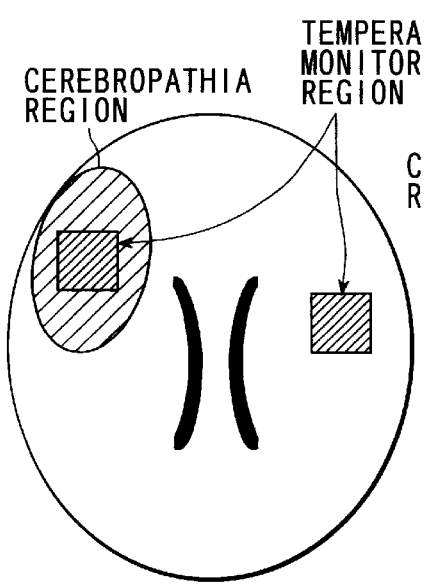
FIG. 3A is a view showing an actual positional relation between a temperature monitoring region designated by a step (b) in FIG. 2 and a cerebropathia region.
Figure 3B:
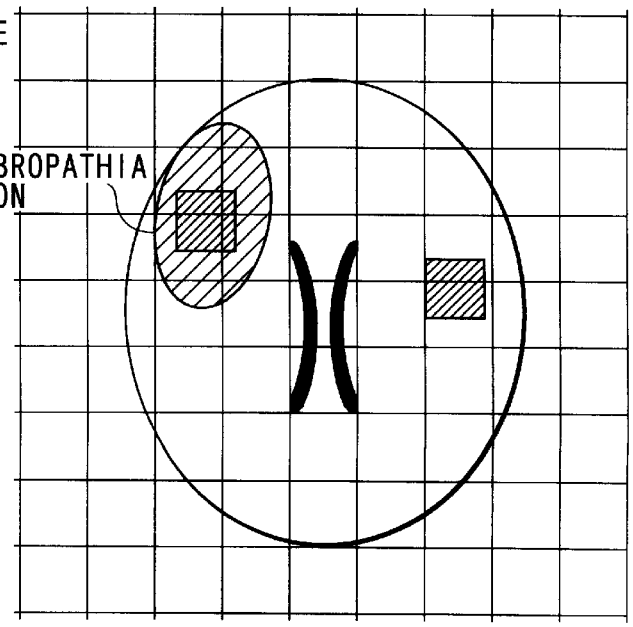
FIG. 3B is a view showing a positional relation, on an MRI image, between the temperature monitoring region designated by a step (b) in FIG. 2 and the cerebropathia region.

A therapeutic planning is determined by utilizing the MR image. At this time, it is desirable that, from the standpoint of reducing the measuring time, an MR signal be observed from one restricted temperature monitoring area. Since, however, there is a case where the brain disease of the subject is spreading or there is no brain edema or infarction focus, etc., at this stage of observation, it is necessary from the standpoint of effecting better temperature control to designate a plurality of temperature monitoring regions, obtain MR signals from the temperature monitoring regions and measure the internal temperature at each temperature monitoring region. The temperature monitoring regions are designated by an operator on the MR image, as shown in FIGS. 3A and 3B, which is obtained at step (b).

In the case where the hypothermia is applied, a circulation pump, cooling mat, monitoring catheter, etc., are properly prepared and set, provided that it is necessary to drive the circulation pump, etc., by an ultrasonic motor, etc., to prevent any adverse influence from the static field or to install a pump body at a location remote from a static magnet body.

A temperature monitoring operation—steps (c) to (i)—is started in synchronization with the start of the hypothermia. The "monitoring" is defined as a sequential observation by an operator of the temperature at the temperature monitoring regions and confirmation as to whether or not the temperature is continued at a desired level. Further, the "temperature monitoring apparatus" is defined as an apparatus for providing information necessary to such a monitoring operation, that is, presenting the temperature and time variation to the operator.

(Flow of the Temperature Monitoring Operation)

First, the pulse sequence for measuring the absolute temperature is executed at step (c).

Then, at step (d), a proton spectrum is calculated by the Fourier transformation from one set of MR signals collected at step (c) and the absolute temperature of the temperature monitoring regions is calculated based on the proton spectrum.

At step (e), the calculated absolute temperature is displayed on the display 13. Or it is possible to provide a plotter output as in the case of the outputs of measuring devices, such as an electrocardiograph, hemomanometer, electroencephalograph and venous blood saturation level meter.

At step (f), the pulse sequence for relative temperature measurement is executed after the absolute temperature has been measured.

At step (g), the relative temperature, that is, the extent to which a current temperature varies from an immediately previous temperature, is calculated based on the phase information on the extent to which the phases of the MR signals collected at step (f) vary from their immediately previous phases.

Then, at step (h), the relative temperature calculated at step (g) is added to the absolute temperature calculated at step (d) to convert the relative temperature into an absolute temperature. The converted absolute temperature is displayed as a numeral value or as a temperature variation graph on the display 13 or outputted from the plotter, not shown—step (i).

Such steps (f) to (i) are repeated until the medical treatment is finished. By doing so, the relative temperatures are sequentially measured and sequentially converted into an absolute temperature so that the absolute temperature is constantly displayed.

(Pulse Sequence for Absolute Temperature measure—Frequency Method)

Figure 4A:
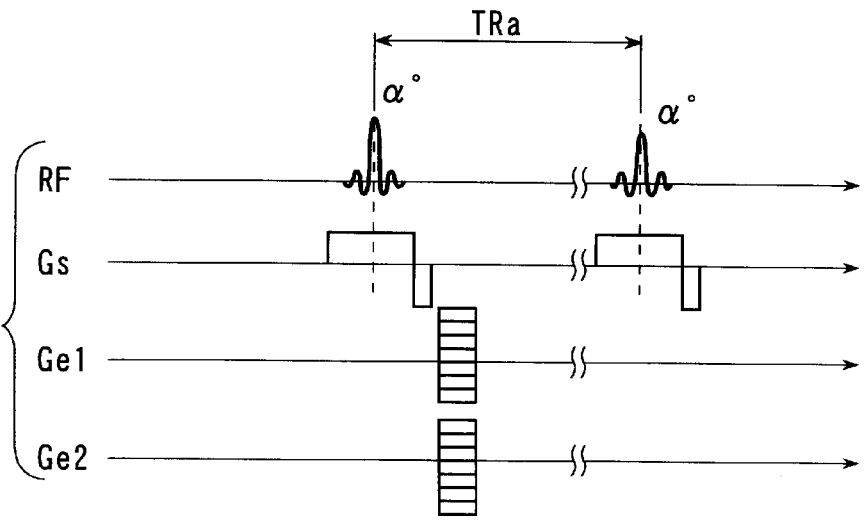
FIG. 4A is a view showing an absolute temperature measuring pulse sequence executed at a step (c) in FIG. 2.

FIG. 4A shows a pulse sequence for measuring the absolute temperature. In this pulse sequence, an RF field pulse of a flip angle α° smaller than 90° is applied together with a slice select gradient field pulse and, subsequently, a gradient field pulse Ge1 for phase encoding relating to a first axis and gradient field pulse Ge2 for phase encoding relating to a second axis are applied. In the word, a phase encode is executed with respect to each of axial directions (Ge1, Ge2) for adding special position information to the MR signals. Thereafter, an MR signal (FID signal) is generated and observed.

The scan time of the pulse sequence for measuring the absolute temperature is given by $TR_a \times N \times M$ where N: the number of phase encoding steps relating to the first axis;

M: the number of phase encoding steps relating to the second axis; and $TR_a$: a repetition time.

(Method for Calculating the Absolute Temperature)

Figure 4B:
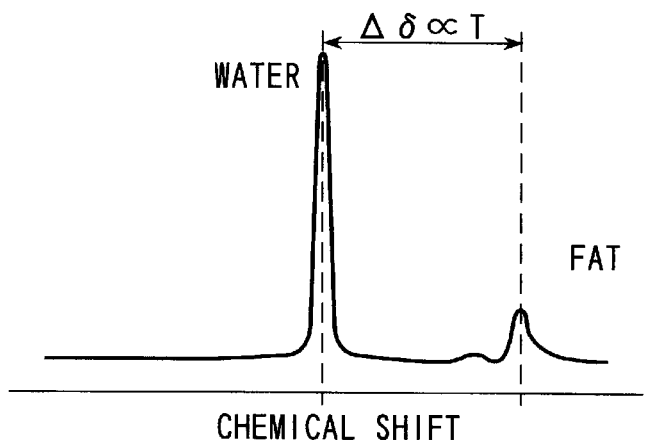
FIG. 4B is a view showing a proton spectrum analyzed from an MR signal acquired at a pulse sequence in FIG. 4A.

FIG. 4B shows a proton spectrum found by the frequency analysis of one set of MR signals collected at the pulse sequence of FIG. 4A. The chemical shift difference between the proton in $H_2O$ and that in fat is 3.38 ppm at 27° C., this corresponding to about 216 Hz under 1.5 teslas. The resonance frequency of the proton in $H_2O$ involves a variation of −0.01 ppm per 1° C. while no such temperature dependence is displayed for the proton in the fat. Therefore, with the fat set as a reference, the absolute temperature can be calculated from the chemical shift difference between the proton in the $H_2O$ and that in the fat.

Since the temperature dependence of the proton in the $H_2O$ is very small, it is necessary to obtain a proton spectrum with a high frequency resolution. To this end, it is necessary to extend the signal observation time. Further, it is considered from the standpoint of the S/N ratio that the signal observation is ended with a time of about T2* and, by the application of a zero insertion to that data, a necessary number of data is obtained to provide an apparently enhanced frequency resolution. It is also effective to enhance the measuring accuracy of the temperature through an ultra-resolution obtained by the spectrum data processing such as a non-linear least squares method.

Since, in the pulse sequence for measuring the absolute temperature, it is possible to, for the reduction of the measuring time, obtain only absolute temperature data on a relatively small number of temperature monitoring regions or on a relatively rough matrix, it is not always possible to measure the absolute temperature on all positions at which relative temperatures are measured by the phase method. Or it may be considered to take a procedure, such as converting those relative temperatures into absolute temperatures only at locations at which an absolute temperature is measured by the frequency method or displaying only a temperature variation at these regions. For this reason, those locations or sites (number of voxels) at which the absolute temperature is measured with the frequency method set at the step (b) for improved therapeutic results become important.

(Pulse Sequence for Measuring the Relative Temperature—Phase Method)

Figure 5:
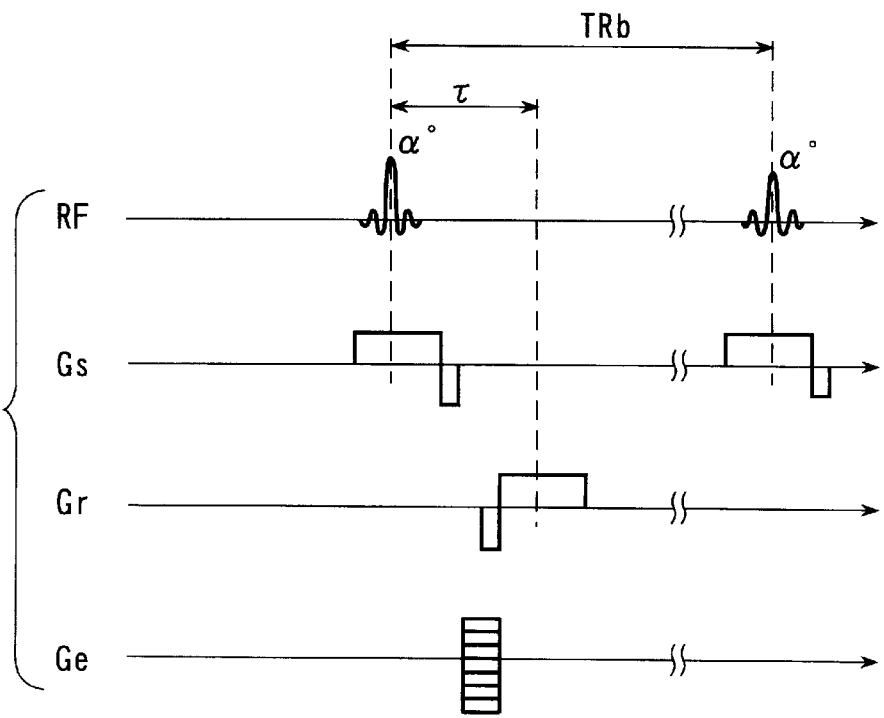
FIG. 5 is a view showing a relative temperature measuring pulse sequence executed at a step (f) in FIG. 2.

In the pulse sequence for measuring the relative temperature, as shown in FIG. 5, an RF field pulse of a flip angle α° smaller than 90° is applied together with a slice select gradient field pulse Gs and, subsequently, a gradient field pulse Ge for phase encoding relating to a first axis is applied. Thereafter, an MR signal (echo) is generated by a polarity-alternated gradient field pulse Gr for frequency encoding. In the word, a phase encode is executed with respect to at least one (Ge) of axial directions for adding special position information to the MR signals, a frequency encode is executed with respect to the remaining axial direction (Gs). Those MR signals are collected during the continuation of the gradient field pulse Gr for frequency encoding.

Here, the scan time of the pulse sequence for measuring the relative temperature is given by $TR_b \times N$ where N denotes the number of phase encoding steps relating to the first axis in the same way as the pulse sequence for measuring the absolute temperature and $TR_b$ ($\approx TR_a$) denotes a repetition time. This time is shorter than the scan time of the pulse sequence for absolute temperature measurement, that is, shorter than the latter scan time by an extent to which no phase encoding is done with respect to the second axis.

Further the condition "TRa >TRb" generally is set, the scan time of the pulse sequence for measuring the relative temperature can be made shorter than that of the pulse sequence for absolute temperature measurement as shown in FIG. 4A. This reason, if being briefly explained, is as follows. The absolute temperature is measured from the frequency information contained in a magnetic resonance signal and, for the pulse sequence for measuring the absolute temperature, the frequency encoding technique cannot be used for the purpose of specifying or localizing a site. Therefore, in order to specify the site on two axes, it is necessary to effect the phase encoding with respect to the two axes. On the other hand, the relative temperature can be measured from the phase information of the MR signal. For this reason, the pulse sequence for the relative temperature can use the frequency encoding technique so as to specify the site. The phase encoding technique and frequency encoding technique can be jointly used so as to specify the site on the two axes. As well known, the pulse sequence using the phase encoding technique requires a time of the repetition time × the number of phase encoding steps. Therefore, the pulse sequence for the absolute temperature effects the phase encoding with respect to the two axes and this scan time becomes a time of the repetition time × both the number of phase encoding steps on the first axis and that of phase encoding steps on the second axis. Further, for the pulse sequence for the relative temperature, the phase encoding has only to be effected with respect to the first axis and this scan time becomes a time of the repetition time (TR) × the number of phase encoding steps on the first axis. For this reason, the scan time for the relative temperature can be made prominently shorter than that for absolute temperature measurement.

(Method for Measuring the Relative Temperature)

A relative temperature, that is, a temperature variation between a time point of a current pulse sequence for relative temperature measurement and a time point of an immediately previous pulse sequence of relative temperature measurement can be calculated, by the following equation, based on a variation (phase difference) between the phase of an MR signal acquired at a current pulse sequence for relative temperature measurement and that of an MR signal acquired at an immediately previous pulse sequence for relative temperature measurement.

$$\Delta T(r) = T(r)_{after} - T(r)_{before}$$
$$= \{(\theta(r)_{after} - \theta(r)_{before})/(\alpha \cdot \gamma \cdot \tau \cdot B_0)\}$$

where r: a space vector

α: a coefficient showing a temperature dependence of a chemical shift of a proton in $H_2O$ γ: a nuclear magetogyric ratio τ: an echo time $B_O$: a static field strength $\theta(r)_{after}$: a phase image at a slightly previous time point $\theta(r)_{before}$: a current phase image (Pulse Sequence Repetition)

FIG. 6A shows a flow of a whole pulse sequence. In FIG. 6A, "A" shows a pulse sequence for absolute temperature measurement and "B" a pulse sequence for relative temperature measurement. As shown in FIG. 6A, according to the present embodiment, a pulse sequence for relative temperature measurement is executed and, subsequently, a pulse sequence for relative temperature measurement is repeatedly executed.

As well-known, in the hypothermia method, the brain temperature is lowered from the start of treatment, through a continued passage of a few hours, to about 4° C. The temperature control at its derivation period and re-warming period becomes very important. Since, in the method (frequency method) for calculating the absolute temperature from a $H_2O$ proton/fat proton chemical shift difference, a scan time of its pulse sequence is relatively long as set out above, the internal temperature cannot be repeatedly measured with a practical indefinite that is short temporal resolution.

In the present embodiment, after the absolute temperature measuring pulse sequence (A) of a longer scan time, the relative temperature measuring pulse sequence of a short scan time is repeatedly executed. Since the relative temperature shows a temperature variation, if an absolute temperature at a given time is known, it follows that, by sequentially adding those associated relative temperatures to that absolute temperature at that given time, the absolute temperature at a subsequent time can be measured with a short temporal resolution.

It is to be noted that the subject, passing through the derivation period of the hypothermia, is placed under a subsequent around-the-clock intensive care and, in order to control the blood pressure, respiration, intracranial pressure and "drip", bio-measurement necessary to the above control is carried out. Although constantly effecting such temperature control is desirable during the intervening time, since the temperature measurement is required during other derivation and re-warming periods of the subject, the subject is withdrawn out of the magnetic resonance apparatus in the case where the internal temperature as well as the state of the subject has to be confirmed. And the subject has to be carried into the intensive care room, etc. It is difficult to calculate an accurate temperature variation, by the phase method, due to an adverse influence by an inhomogeous magnetic field resulting from a positional displacement of the subject involved at the insertion and withdrawal of the subject into and out of the magnetic resonance apparatus. In the case where such an internal temperature measurement is interrupted, an absolute temperature is again measured by the frequency method and then a relative temperature is measured by the phase method to convert the relative temperature into the absolute temperature.

There are sometimes the cases where, during the monitoring of the internal temperature while effecting the repeated measurement of the relative temperature by the repetition of the phase method and repeated conversion of the relative temperature to the absolute temperature, a measuring temperature involves an error resulting from the motion of the subject. FIG. 6B shows a flow of a pulse sequence for realizing the detection of a motion error and initialization of the absolute temperature. When a designation is made either periodically or by an operator during the repetition of the relative temperature measuring pulse sequence ("B"), the interruption of the absolute temperature measuring pulse sequence ("A") is executed.

FIG. 7A shows a proton spectrum found through the application of a frequency analysis of those MR signals acquired at the absolute temperature measuring pulse sequence at time $t_0$ in FIG. 6B. FIG. 7B shows a proton spectrum found through the application of the frequency analysis of the MR signals acquired at the absolute temperature measuring pulse sequence in time $t_1$ in FIG. 6B. The resonance frequency of the proton in fat was $\upsilon_0$. Let it be assumed that, at time $t_1$, the resonance frequency of the proton in the fat varies to $\upsilon_1$. It is considered that, since the resonance frequency of the proton in the fat reveals no temperature dependence, the time variation of the resonance frequency of the proton in the fat has a high possibility of the internal temperature monitoring region being displaced due to the motion of the subject so that a magnetic environment around it varies.

When the time variation $(\upsilon_0 - \upsilon_1)$ of the resonance frequency has becomed too great to be disregarded and the difference $(\upsilon_0 - \upsilon_1)$ has exceeded a specified threshold value, then a motion error is detected, displaying a message showing that the relative temperature measured during a time period $t_0 - t_1$ and an absolute temperature converted therefrom have a lower reliability level.

Further, the temperature on the basis of which the relative temperature is converted to the absolute temperature is replaced by the absolute temperature at time $t_1$. During a treatment time as long as 24 hours, a calibration is made by utilizing the frequency method so that no motion error will grow in a cumulative way. It is, therefore, possible to continue an internal temperature monitoring with high accuracy. At such a calibration time or in the cases where a plurality of subjects are to be measured in an alternate way, it is necessary to interrupt the measurement and it is desired from the standpoint of the condition control that those graphs representing sequential temperature variations acquired both before and after such interruption be joined as a continuous one.

As set out above, according to the present embodiment, the temperature of the injury or the others in the subject during the hypothermia can be measured, as an absolute temperature, with a shorter temporal resolution.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A temperature monitoring apparatus comprising:
a radio frequency magnetic field generator configured to generate a radio frequency magnetic field;
a gradient magnetic field generator configured to generate a gradient magnetic field;
a detector configured to detect a magnetic resonance signal from a subject;
a sequence controller configured to control the radio frequency magnetic field generator, the gradient magnetic field generator, and the detector, and configured to execute an absolute temperature measuring pulse sequence and repeatedly execute a relative temperature measuring pulse sequence following the absolute temperature measuring pulse sequence; and
a first processing mechanism configured
to calculate the absolute temperature of a region of interest in the subject based on frequency information of the magnetic resonance signal detected from the subject in response to the absolute temperature measuring pulse sequence,
to calculate the relative temperature of the region of interest in the subject based on phase information of the magnetic resonance signal detected from the subject in response to the relative temperature measuring pulse sequence, and
to convert the measured relative temperature to a corresponding absolute temperature based on the calculated absolute temperature.

2. The temperature monitoring apparatus of claim 1, wherein:
the first processing mechanism calculates the absolute temperature based on a chemical shift difference between a specific nucleus in a first molecule and the specific nucleus in a second molecule, and
a first magnetic resonance frequency of the first molecule is temperature dependent, and a second magnetic resonance frequency of the second molecule is not temperature dependent.

3. The temperature monitoring apparatus of claim 1, wherein:
the first processing mechanism calculates the relative temperature based on a phase variation of the magnetic resonance signal detected from a specific nucleus in a first molecule, and
a magnetic resonance frequency of the first molecule is temperature dependent.

4. The temperature monitoring apparatus of claim 1, wherein the sequence controller executes as the absolute temperature measuring pulse sequence the following sequence:
a radio frequency magnetic field pulse applied concurrently with a slice select gradient magnetic field pulse, followed by
a first encoding gradient magnetic field pulse applied concurrently with a second encoding gradient magnetic field pulse,
the first encoding gradient magnetic field pulse providing phase encoding and being executed with respect to a first axial direction, the second encoding gradient magnetic field pulse providing phase encoding and being executed with respect to a second axial direction, and
the first encoding gradient magnetic field pulse and the second encoding gradient magnetic field pulse adding position information to the magnetic resonance signal detected from the subject.

5. The temperature monitoring apparatus of claim 1, wherein the sequence controller executes as the relative temperature measuring pulse sequence the following sequence:
a radio frequency magnetic field pulse applied concurrently with a slice select gradient magnetic field pulse, followed by
a phase encoding gradient magnetic field pulse applied concurrently with a frequency encoding gradient magnetic field pulse,
the phase encoding gradient magnetic field pulse providing phase encoding and being executed with respect to a first axial direction and adding position information to the magnetic resonance signal detected from the subject, and
the frequency encoding gradient magnetic field pulse being executed with respect to a second axial direction.

6. The temperature monitoring apparatus of claim 1, further comprising:
a second processing mechanism configured
to calculate a magnetic resonance frequency based on the magnetic resonance signal detected from a specific nucleus in a specific molecule, and
to detect a motion error of the subject based on a temporal variation of the calculated magnetic resonance frequency;
wherein a magnetic resonance frequency of the specific molecule is not temperature dependent.

7. A magnetic resonance apparatus, comprising:
a radio frequency magnetic field generator configured to generate a radio frequency magnetic field;
a gradient magnetic field generator configured to generate a gradient magnetic field;
a detector configured to detect a magnetic resonance signal from a subject;
a sequence controller configured to control the radio frequency magnetic field generator, the gradient magnetic field generator, and the detector, and configured to execute an absolute temperature measuring pulse sequence and subsequently, to execute repeatedly a relative temperature measuring pulse sequence;
a first processing mechanism configured to calculate the absolute temperature of a region of interest in the subject based on frequency information of the magnetic resonance signal detected from the subject in response to the absolute temperature measuring pulse sequence; and
a second processing mechanism configured to calculate the relative temperature of the region of interest based on phase information of a magnetic resonance signal detected from the subject in response to the relative temperature measuring pulse sequence.

8. The magnetic resonance apparatus of claim 1, wherein the sequence controller executes as the absolute temperature measuring pulse sequence the following sequence:
a radio frequency magnetic field pulse applied concurrently with a slice select gradient magnetic field pulse, followed by a first encoding gradient magnetic field pulse applied concurrently with a second encoding gradient magnetic field pulse, the first encoding gradient magnetic field pulse providing phase encoding and being executed with respect to a first axial direction, the second encoding gradient magnetic field pulse providing phase encoding and being executed with respect to a second axial direction, and the first encoding gradient magnetic field pulse and the second encoding gradient magnetic field pulse adding position information to the magnetic resonance signal detected from the subject.

9. The magnetic resonance apparatus of claim 1, wherein the sequence controller executes as the relative temperature measuring pulse sequence the following sequence:

a radio frequency magnetic field pulse applied concurrently with a slice select gradient magnetic field pulse, followed by a phase encoding gradient magnetic field pulse applied concurrently with a frequency encoding gradient magnetic field pulse, the phase encoding magnetic field pulse providing phase encoding and being executed with respect to a first axial direction, and adding position information to the magnetic resonance signal detected from the subject, and the frequency encoding gradient magnetic field pulse being executed with respect to a second axial direction.

10. The magnetic resonance apparatus of claim 7, further comprising:

a third processing mechanism configured
to calculate a magnetic resonance frequency based on the magnetic resonance signal detected from a specific nucleus in a specific molecule, and
to detect a motion error of the subject based on a temporal variation of the calculated magnetic resonance frequency,
a magnetic resonance frequency of the specific molecule is not temperature dependent.

11. A method for monitoring a temperature, comprising:

executing an absolute temperature measuring pulse sequence;

measuring the absolute temperature of a region of interest in a subject based on frequency information of a magnetic resonance signal detected from the subject in response to the absolute temperature measuring pulse sequence; and determining repeatedly a corresponding absolute temperature from a relative temperature, including
executing a relative temperature measuring pulse sequence, including,
measuring the relative temperature of the region of interest in the subject based on phase information of the magnetic resonance signal detected from the subject in response to the relative temperature measuring pulse sequence, and
converting the relative temperature into the corresponding absolute temperature based on the absolute temperature.

12. The method of claim 11, wherein measuring of the absolute temperature comprises calculating the absolute temperature based on a chemical shift difference between a specific nucleus in a first molecule and the specific nucleus in a second molecule, and a first magnetic resonance frequency of the first molecule is temperature dependent, and a second magnetic resonance of the second molecule is not temperature dependent.

13. The method of claim 11, wherein measuring the relative temperature comprises measuring a phase variation of the magnetic resonance signal detected from a specific nucleus in a first molecule, and a magnetic resonance frequency of the first molecule is temperature dependent.

14. The method of claim 11, wherein executing the absolute temperature measuring pulse sequence comprises, applying a radio frequency magnetic field pulse concurrently with a slice select gradient magnetic field pulse, followed by applying a first encoding gradient magnetic field pulse concurrently with a second encoding gradient magnetic field pulse, the first encoding gradient magnetic field pulse providing phase encoding and being executed with respect to a first axial direction, the second encoding gradient magnetic field pulse providing phase encoding and being executed with respect to a second axial direction, and the first encoding gradient magnetic field pulse and the second encoding gradient magnetic field pulse adding position information to the magnetic resonance signal detected from the subject.

15. The method of claim 11, wherein executing repeatedly the relative temperature measuring pulse sequence comprises:

applying a radio frequency magnetic field pulse concurrently with a slice select gradient magnetic field pulse, followed by applying a phase encoding gradient magnetic field pulse concurrently with a frequency encoding gradient magnetic field pulse, the phase encoding magnetic field pulse providing phase encoding and being executed with respect to a first axial direction, and adding position information to the magnetic resonance signal detected from the subject, and the frequency encoding gradient magnetic field pulse being executed with respect to a second axial direction.

16. The method of claim 11, further comprising:

receiving an instruction to interrupt the determining repeatedly step;

performing the executing the absolute temperature measuring pulse sequence step;

performing the measuring the absolute temperature step; and performing the determining repeatedly step.

17. The method of claim 16, wherein performing the measuring the absolute temperature step comprises determining a new value of the absolute temperature.

18. The method of claim 16, further comprising after the measuring the absolute temperature step:

calculating a magnetic resonance frequency based on the magnetic resonance signal detected from a specific nucleus in a specific molecule; and detecting a motion error of the subject based on a temporal variation of the calculated magnetic resonance frequency, a magnetic resonance frequency of the specific molecule not being temperature dependent.

19. A method for monitoring a temperature comprising:

executing an absolute temperature measuring pulse sequence;

measuring the absolute temperature of a region of interest in a subject based on frequency information of a magnetic resonance signal detected from the subject in response to the absolute temperature measuring pulse sequence;

determining repeatedly a corresponding absolute temperature from a relative temperature, including
executing a relative temperature measuring pulse sequence
measuring the relative temperature of the region of interest in the subject based on phase information of the magnetic resonance signal detected from the subject in response to the relative temperature measuring pulse sequence, and
converting the relative temperature into the corresponding absolute temperature based on the absolute temperature; and performing repeatedly
the executing the absolute temperature measuring pulse sequence step,
the measuring the absolute temperature step, and
the determining repeatedly step.

20. The method of claim 19, further comprising after the measuring the absolute temperature step:

calculating a magnetic resonance frequency based on the magnetic resonance signal detected from a specific nucleus in a specific molecule; and detecting a motion error of the subject based on a temporal variation of the calculated magnetic resonance frequency, a magnetic resonance frequency of the specific molecule not being temperature dependent.

* * * * *